United States Patent [19]

Chung et al.

[11] Patent Number: 5,452,261
[45] Date of Patent: Sep. 19, 1995

[54] SERIAL ADDRESS GENERATOR FOR BURST MEMORY

[75] Inventors: Jinyong Chung, Los Altos Hills, Calif.; Michael A. Murray, Bellevue, Wash.

[73] Assignee: Mosel Vitelic Corporation, San Jose, Calif.

[21] Appl. No.: 265,535

[22] Filed: Jun. 24, 1994

[51] Int. Cl.⁶ .............................................. G11C 8/00
[52] U.S. Cl. .................................. 365/233; 365/221; 365/236; 365/239; 365/230.06; 365/230.08
[58] Field of Search ...................... 365/230.01, 230.06, 365/230.08, 230.09, 236, 239, 240, 221, 233

[56] References Cited

U.S. PATENT DOCUMENTS

| | | | |
|---|---|---|---|
| 5,097,447 | 3/1992 | Ogawa | 365/230.09 X |
| 5,146,431 | 9/1992 | Eby | 365/236 X |
| 5,260,905 | 11/1993 | Mori | 365/230.09 X |

*Primary Examiner*—David C. Nelms
*Assistant Examiner*—Son Mai
*Attorney, Agent, or Firm*—Skjerven, Morrill, MacPherson, Franklin & Friel; Norman R. Klivans

[57] ABSTRACT

A serial address generator for a sequential (burst mode) random access memory generates a sequence of internally generated addresses for fast cycling. The start address is externally provided. Then, as the clock signals arrive, the subsequent addresses are generated in sequence by the address sequencer. The address sequencer is preset to the second address in the sequence following the start address. Simultaneously, the start address is connected by an external address enable switch to an output terminal of the address generator, bypassing the address sequencer. When the first clock signal arrives at the address sequencer, the address sequencer output is sampled by closing an internal address enable switch and opening the external address enable switch. Thus the internally generated addresses are provided immediately following the start address. The address sequencer thereby generates each address one clock cycle ahead of that in the prior art, and the output address is provided one half clock cycle ahead of that in the prior art.

14 Claims, 16 Drawing Sheets

KEY TO

| FIG. 5A | FIG. 5B |

KEY TO FIG. 6

| FIG. 6A | FIG. 6B | FIG. 6C |
|---|---|---| ns
SERIAL ADDRESS GENERATOR FOR BURST MEMORY

BACKGROUND OF THE INVENTION

1. Field of the Invention

This disclosure relates to random access memory and specifically to a serial address generator for a burst-type random access memory.

2. Description of the Prior Art

Video RAM (random access memory), synchronous RAM and burst RAM each require a sequence of internally generated addresses for faster cycling and prevention of the external address bus lines from fast switching to suppress switching noise in the system. Typically the start address of a particular address burst is provided from an external source (a host computer or a processor) and as subsequent clock signals arrive at the address generator, the following addresses in the burst are generated continuously in sequence for the duration of the burst. The prior art presets the address sequencer (typically a counter) to the externally provided start address ($A_n$) in response to a PRESET signal. The address sequencer output is updated with each $\phi_{clock}$ rising edge, and the outputs of the address generator are sequentially $A_n$, $A_{n+1}$, $A_{n+2}$, etc.

Such a prior art address generator is shown in FIG. 1A including address sequencer 12 outputting the sequence of addresses to an output buffer 14. The three input signals to the address sequencer 12 are the input address signal (the start address $A_n$), the $\phi_{clock}$ signal, and the PRESET signal. Additionally, a sequence control signal controls whether the address sequencer 12 counts up or down. In most applications, upcounting is used, and this function is built in, rather than being a control function. The associated timing diagram is shown in FIG. 2A.

Typically the address sequencer 12 (counter) includes a master side and a slave side, each initially set to the start address $A_n$. It is to be understood that the device of FIG. 1A is a parallel device, where the start address $A_n$ is a multi-bit address provided by a plurality of lines, i.e. an address bus. The address out signal is also provided on a multi-line bus.

As seen in FIG. 2A, the first address out $A_n$ is output to buffer 14 when the Preset signal is applied, and kept until leading edge of $\phi_{clock}$ arrives. The second address out $A_{n+1}$ is output to buffer 14 at the trailing edge of $\phi_{clock}$ and the following addresses are updated at every trailing edge of the $\phi_{clock}$ signal.

The address generator of FIG. 1A functions adequately; however it is slower than desired. Faster operation is desirable to improve system performance such as needed in a typical burst DRAM (dynamic random access memory) chip. The FIG. 1A address generator delivers the first address late, due to the propagation delay through the counters inside the address sequencer. This means a shorter start address duration time.

To improve the start address delivery, in a second prior art address generator the start address is provided from the Address Input directly, instead of going through the counters. (See FIG. 1B, and corresponding timing diagram FIG. 2B).

Rather than providing the start address $A_n$ to the address sequencer as in FIG. 1A, the address sequencer 12 of FIG. 1B is bypassed before and during the preset period by means of external address enable switch 24 and internal address enable switch 26, and the start address is provided directly to the output buffer via external address enable switch 24. This (start) address $A_n$ is therefore available almost immediately as the address out at buffer 14, without processing by the address sequencer 12.

However, further performance improvement (i.e., higher speed) is desirable in terms of address output.

SUMMARY OF THE INVENTION

In the above described prior art, the second address $A_{n+1}$ is delivered by the address sequencer to the output buffer at the time of the trailing edge of the first $\phi_{clock}$ cycle. In accordance with the invention, instead the second address $A_{n+1}$ is delivered to the output buffer at the leading edge of the $\phi_{clock}$ signal. Thus one half of a clock cycle is gained for each address burst.

After provision to the output buffer of the first address $A_n$ (which is externally supplied as in FIG. 1B) the external address line is disconnected from the output buffer by an external address enable switch, and an internal address enable switch which connects the address sequencer to the output buffer is closed, allowing the address sequencer to provide the subsequent internally generated address $A_{n+1}$ to the output buffer, also as in FIG. 1B. Then, during the time that the start address $A_n$ is being provided to the output buffer, the address sequencer operates to calculate the subsequent address $A_{n+1}$. The output addresses of each burst are thereby, each provided to the output buffer approximately $\frac{1}{2}$ of a clock cycle earlier than in the prior art of FIG. 1B.

The externally provided address and the address out both begin with the same address $A_n$ which is the initial address in the burst, while using the preset signal to advance the counting of the sequence by one count.

Therefore, the address sequencer is preset to address $A_{n+1}$ (the second address in the burst) following the externally provided start address $A_n$. When the first clock signal arrives at the address sequencer, the address sequencer output is sampled by enabling the internal address enable (second) switch and disabling the external address enable (first) switch. The address sequencer output is updated with each rising edge of the clock signal $\phi_{clock}$. Thereby the address sequencer generates each address one clock cycle ahead of the time that address would have been generated in the prior art, and the address output is supplied to the output buffer $\frac{1}{2}$ clock cycle ahead of the prior art (FIG. 2B) timing. As in the prior art, the address sequencer includes a master/slave counter. However, in accordance with the invention and in order to set the address sequencer initially to the second address $A_{n+1}$, the master side of the counter is initially set to value $A_n$, and the slave side of the counter is initially set to value $A_{n+1}$. This provides the desired incremental timing advantage over the prior art.

The present invention is applicable specifically to burst DRAM (dynamic RAM) operating in page mode, and is also applicable to other types of burst memory using sequential type addressing.

In accordance with the invention, operation of the address generator is the same as in the prior art except during the preset cycle. Thus the performance advantage is gained during the preset portion of the address burst. Since the addresses are output one-half cycle ahead of that provided in the prior art, this improves the operational performance of the system in which the burst memory is installed.

DETAILED DESCRIPTION OF THE INVENTION

Figure 3:
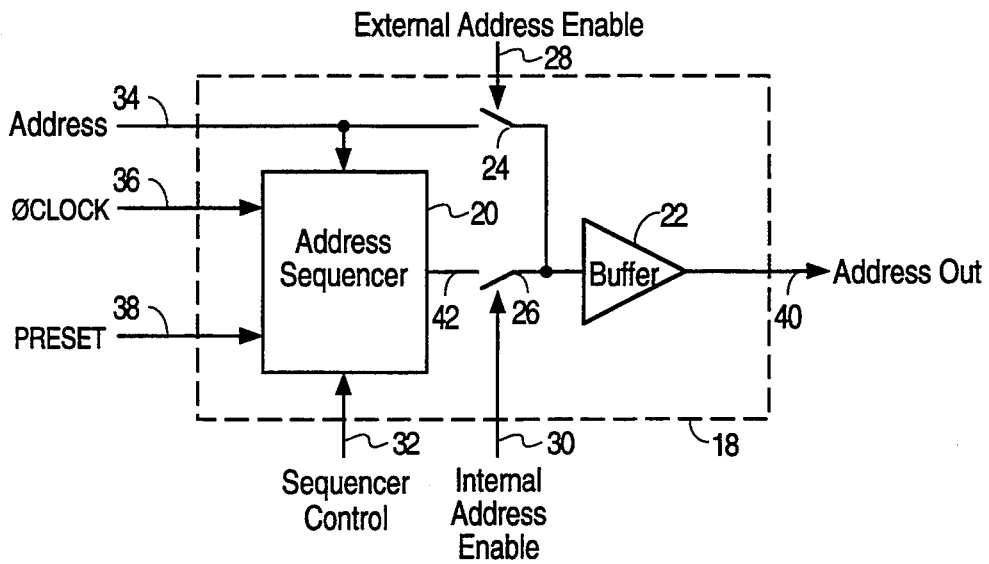
FIG. 3 shows an address generator in accordance with the present invention.

FIG. 3 shows in a block diagram serial address generator 18 in accordance with the invention. Address generator 18 includes address sequencer 20, output buffer 22, external address enable switch 24 (as in FIG. 1B) actuated by an external address enable control signal 28, and internal address enable switch 26 (as in FIG. 1B) actuated by an internal address enable control signal 30. Thus the serial address generator of FIG. 3 appears in the block diagram to be similar to the serial address generator of FIG. 1B; the distinction is in the internal structure and operation of address sequencer 20, which differs significantly from address sequencer 12 of FIGS. 1A and 1B.

Figure 1A:
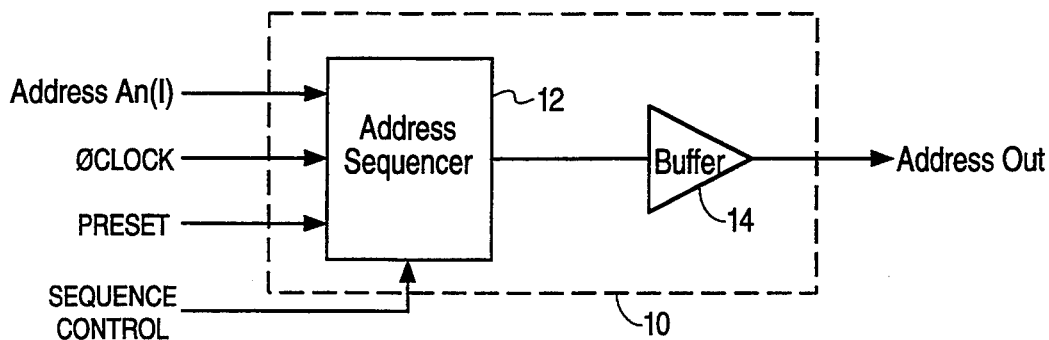
FIGS. 1A, 1B show prior art address generators.
Figure 2A:
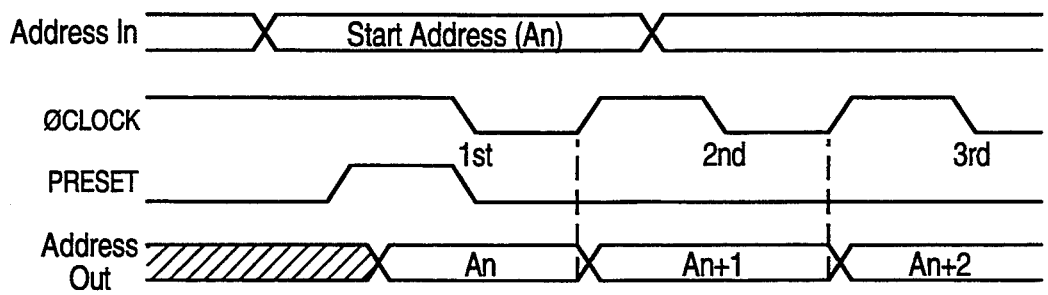
FIGS. 2A, 2B show timing diagrams for the prior art address generators of respectively FIGS. 1A, 1B.
Figure 1B:
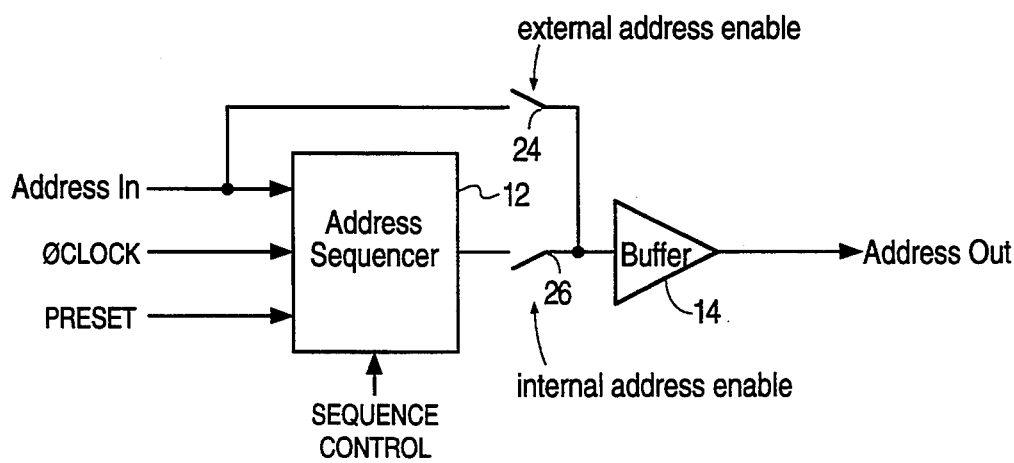

Sequence control signal 32 (as in the prior art) determines whether address sequencer 20 is an up or down counter. Input signals on lines 34, 36 and 38 are conventional (as in the prior art). The output address ("address out") is provided on line 40. This circuit, like that of FIGS. 1A and 1B, is a parallel device providing a multi-bit address. Hence address line 34, the output from the address sequencer on line 42, and the address out line 40 each represent multi-line busses with as many lines as there are address bits in the particular application.

Figure 4:
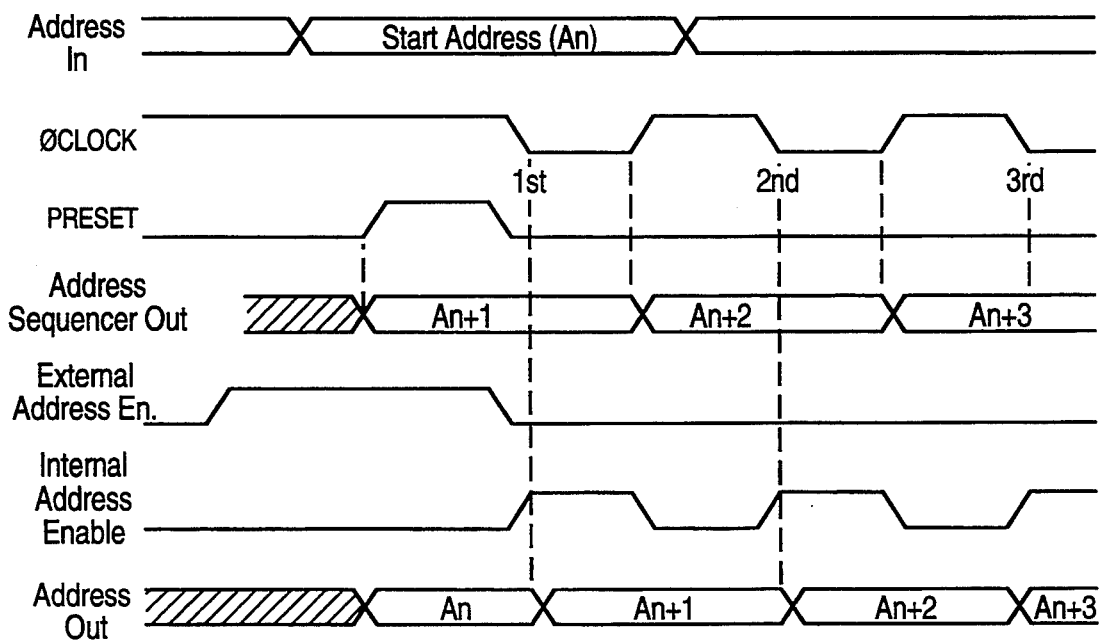
FIG. 4 shows a timing diagram for the address generator of FIG. 3.

FIG. 4 illustrates timing for the address generator of FIG. 3, and specifically the timing for external address switch 24 and internal address switch 26 as controlled respectively by their control signals 28, 30 of FIG. 3. Initially, external address enable switch 24 is closed (the external address enable control signal 28 is high) thus providing the externally provided address on line 34 directly to buffer 22. After the initial address $A_n$ (which is externally provided) is provided to buffer 22, the signal $\phi_{clock}$ goes low, and the external address enable control signal 28 goes low, then the internal address enable signal 30 goes high, closing switch 26. At this time the address sequencer 20 has generated the second address $A_{n+1}$.

Figure 2B:
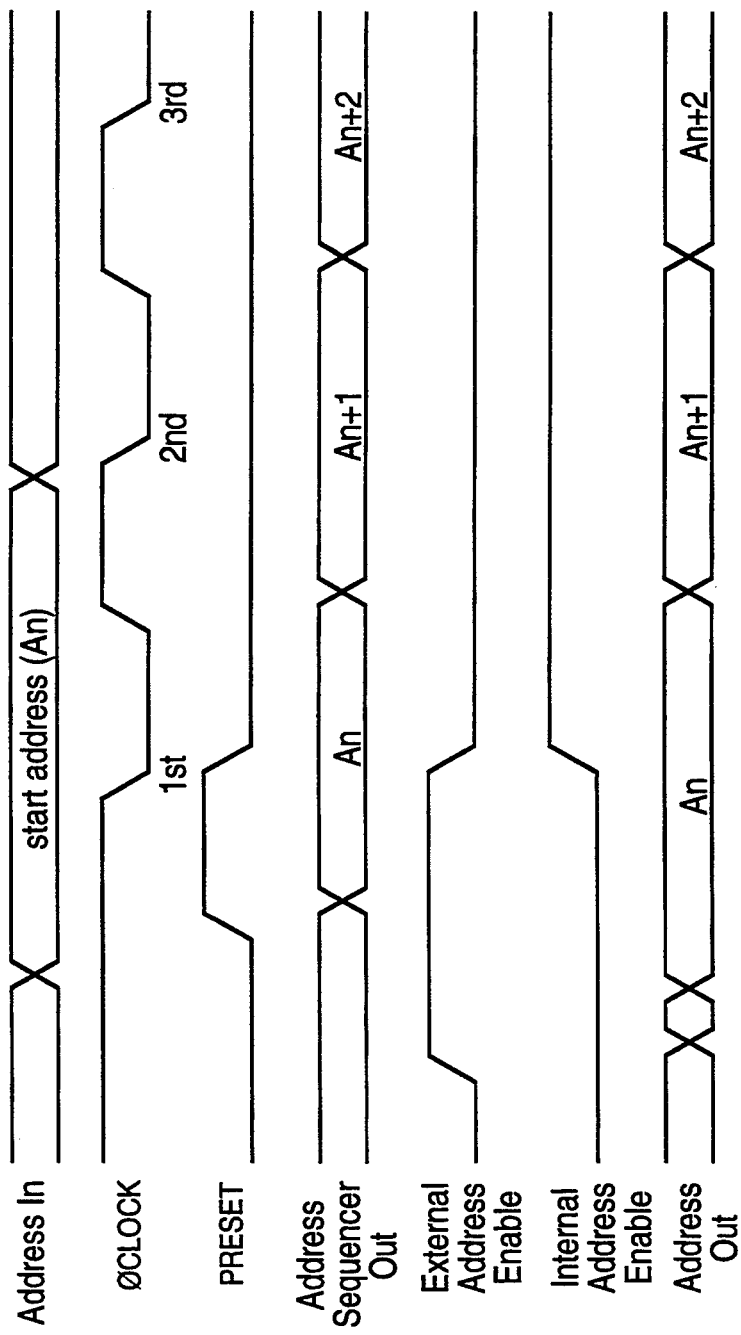

As seen in the timing diagram of FIG. 4, generation of the second address $A_{n+1}$ overlaps with provision of the start address $A_n$. Thus within the first two $\phi_{clock}$ cycles, all of start address $A_n$ and second address $A_{n+1}$ are output to buffer 22, in contrast to the prior art of FIG. 2B in which only 1½ addresses are outputted within the first two occurrences of clock cycles $\phi_{clock}$. This half-clock cycle advantage is the chief benefit of the present invention. Thus the generation of addresses ("Address sequencer out" in FIG. 4) is one clock cycle ahead of that in the prior art, and there is also a half clock timing advantage in the output addresses ("Address out") in contrast to the prior art of FIG. 2B.

In one embodiment the serial address generator of FIG. 3 is for use in a burst RAM operating in page mode, with the externally provided address being the first (start) address for each page. Therefore for example a RAM chip having 512 words per page requires nine bit addresses, i.e., $2^9 = 512$. Thus, the address sequencer is a nine-bit counter. The serial address generator in accordance with the invention is also be suitable for other (non-page mode) types of serially generated addresses, with the addition of conventional stop circuitry to terminate a burst of predetermined length.

It is to be appreciated that the serial address generator of FIG. 3 is used in place of conventional serial address generator of FIGS. 1A, 1B as a portion typically of a RAM chip. The address out signal provided on line 40 is conventionally connected to an address decoder which selects the desired memory cell or cells to be written to or read from. (The remainder of the RAM chip is not illustrated herein as being conventional.)

FIGS. 5 through 10 show a detailed schematic of one embodiment of the present invention, corresponding to that shown in the block diagram of FIG. 3 except that the sequence control is not shown, due to only upcounting being available. In FIGS. 5 through 10 the small numbers adjacent each logic gate indicate the width (in micrometers) of each transistor gate of the logic gate. Thus, "P" indicates the width of a P channel transistor gate and "N" indicates the width of an N channel transistor gate. The gate length is equal for all transistors except where a two number notation is used i.e., "48/2" means the transistor gate width is 48 micrometers and the transistor gate length is 2 micrometers. The standard (default) transistor gate length is 1.2 micrometers, for this embodiment.

Figure 9A:
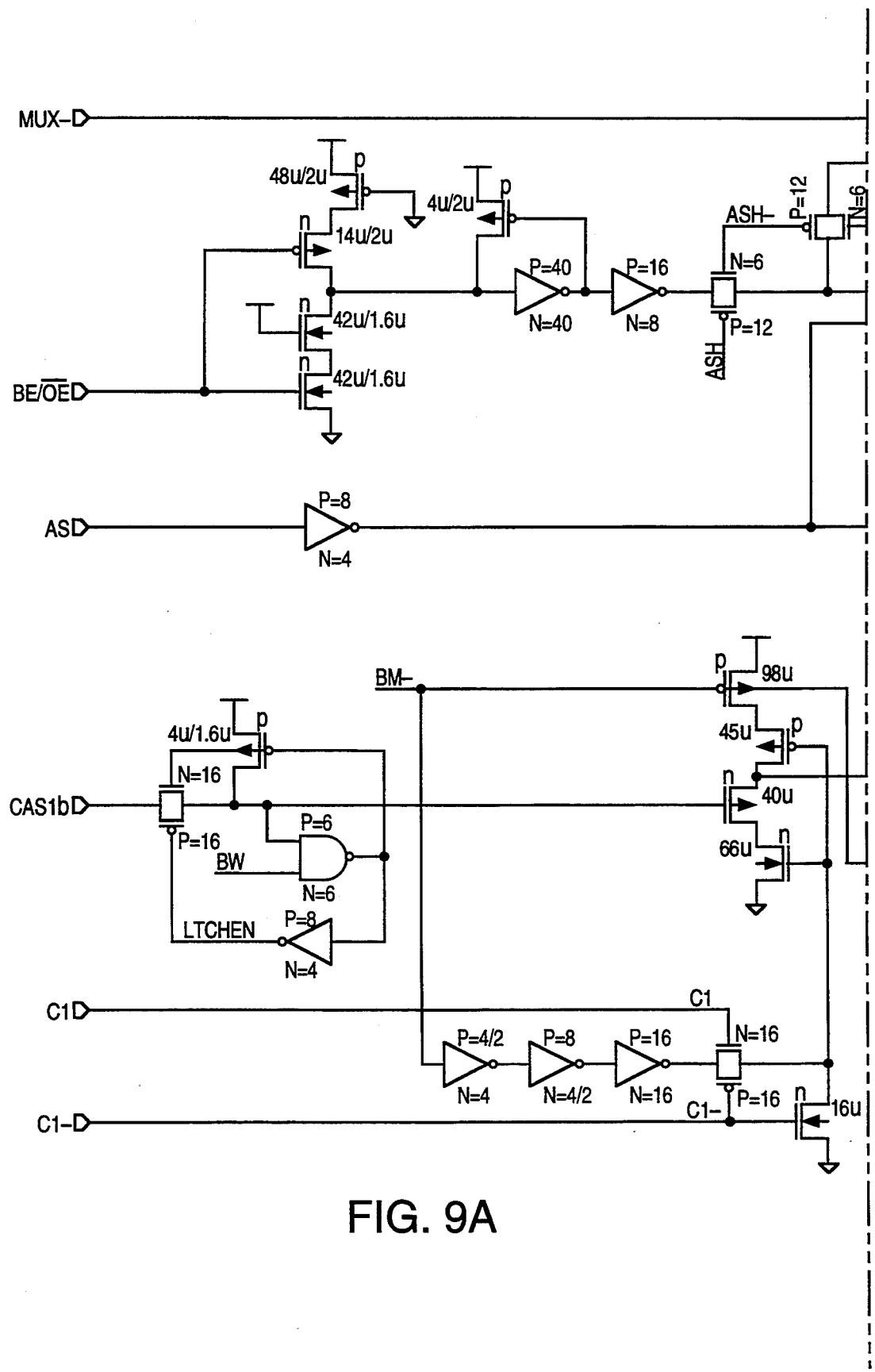
Figure 9B:
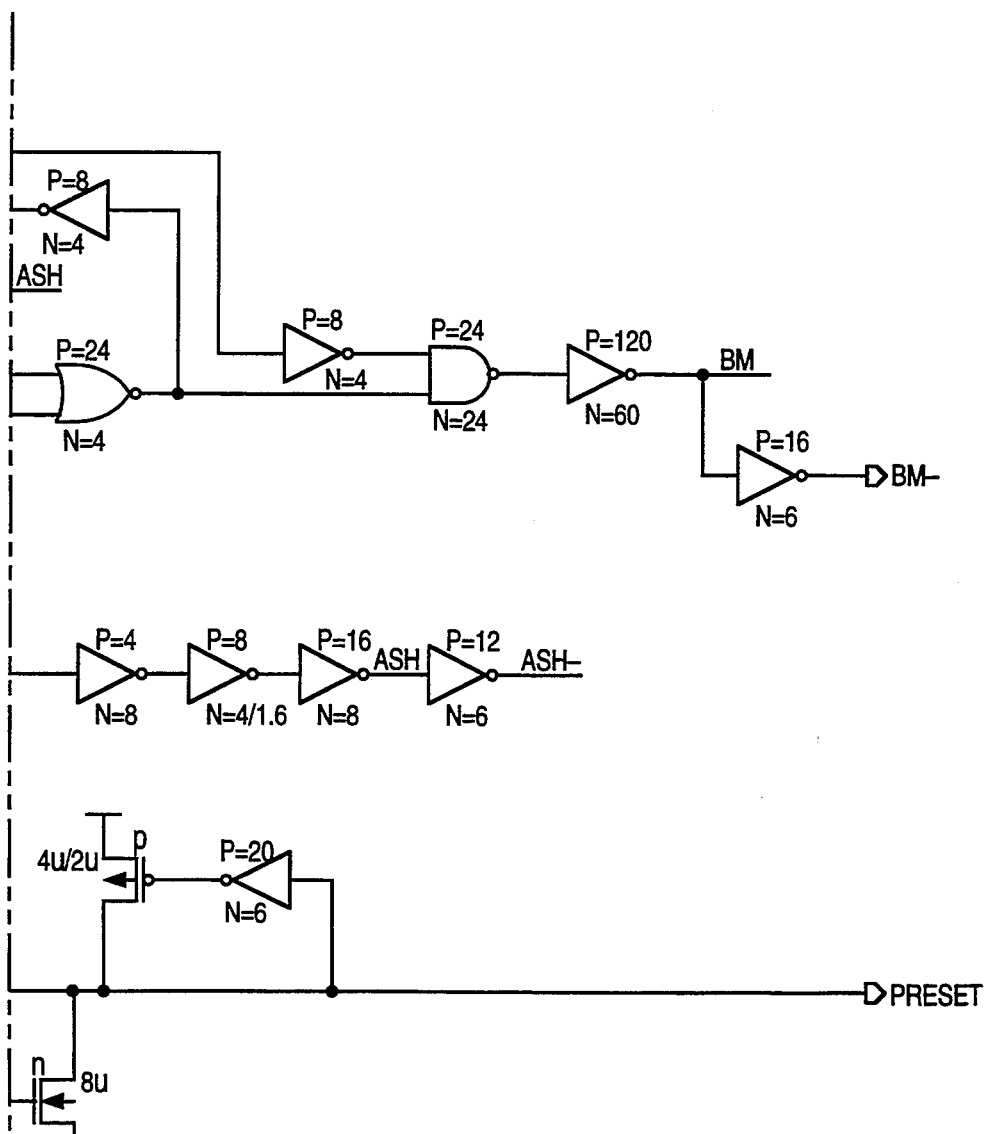
Figure 10:
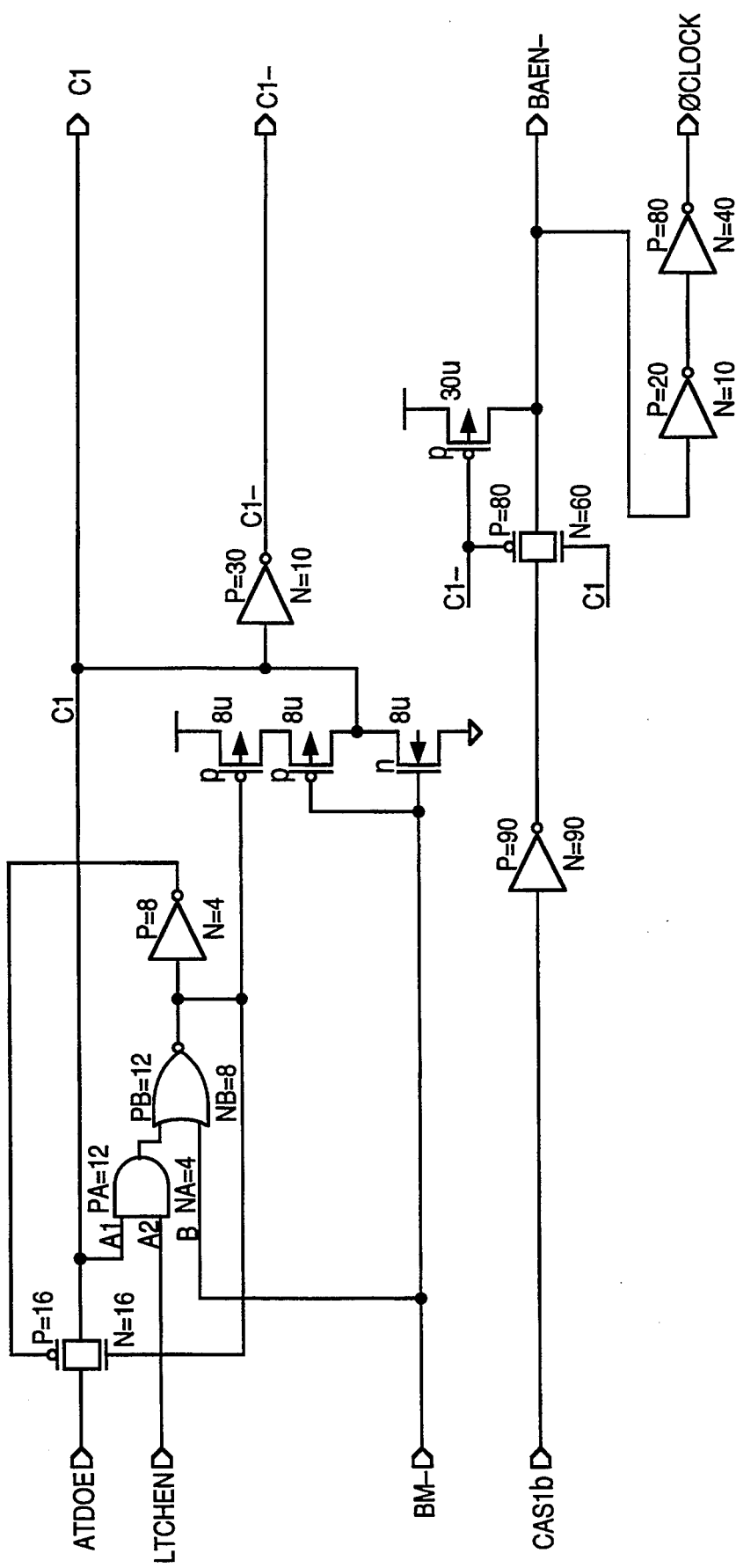
Figure 11A:
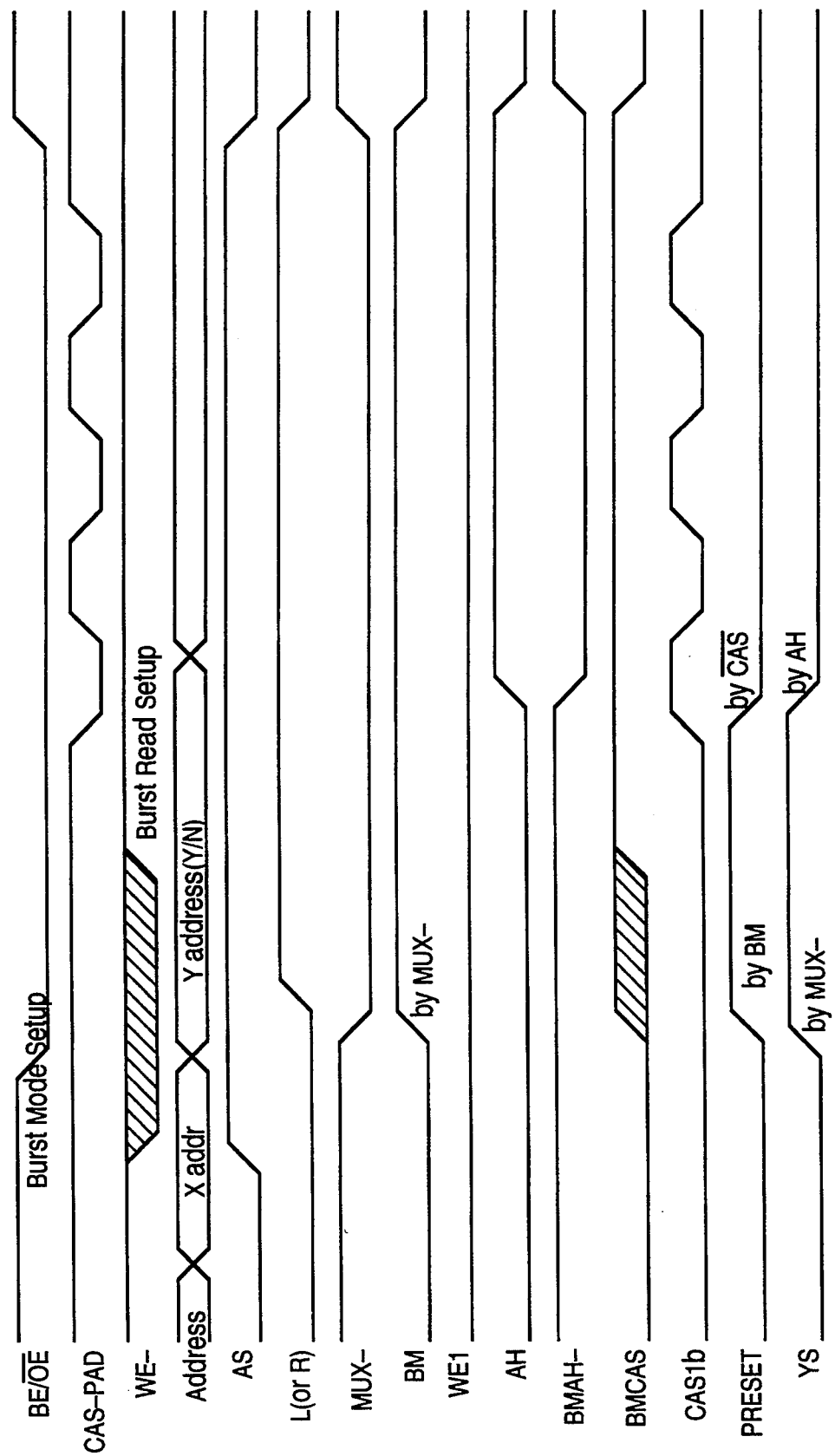
FIGS. 11(a) and 11(b) show a timing diagram for an address generator in accordance with the present invention.
Figure 11B:
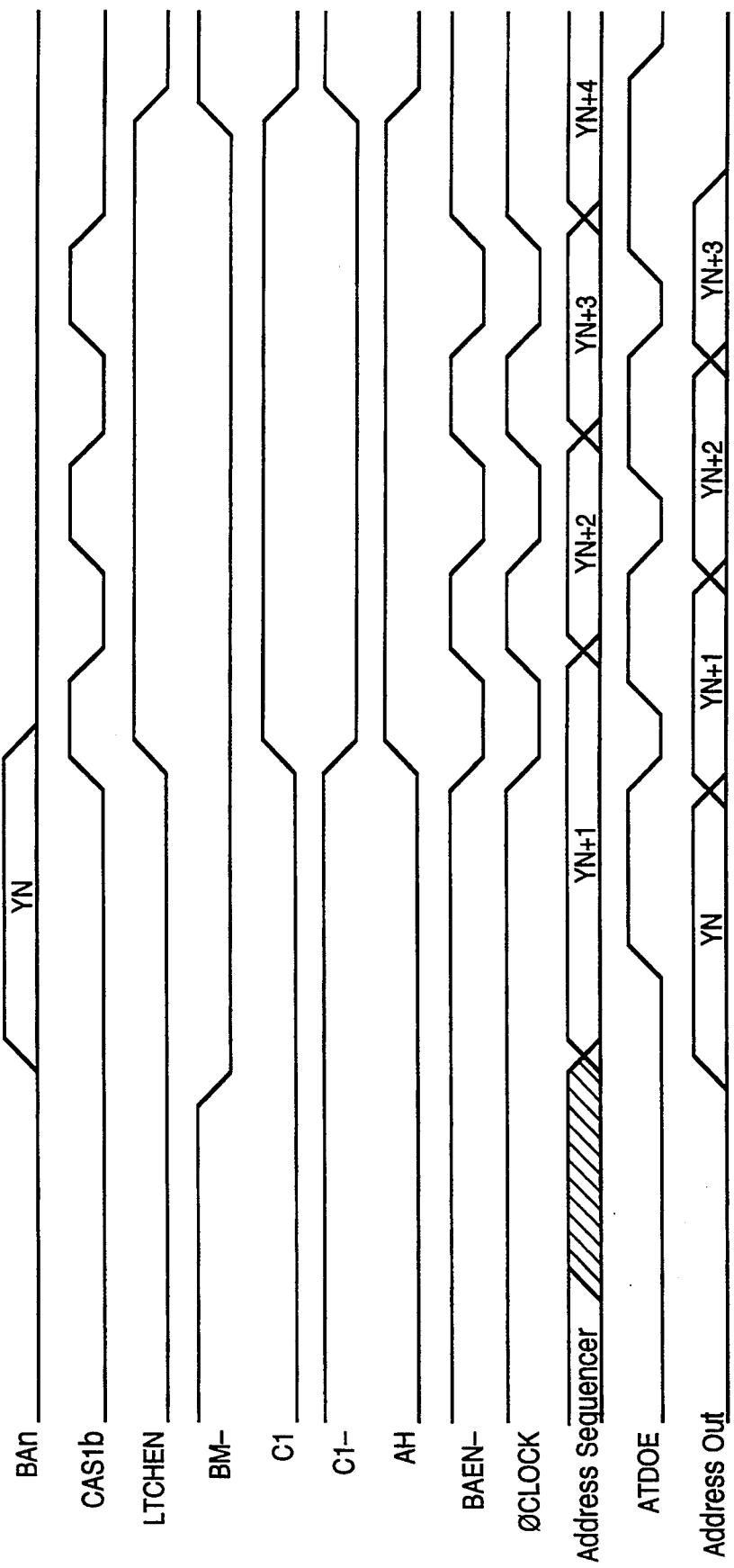
Figure 7:
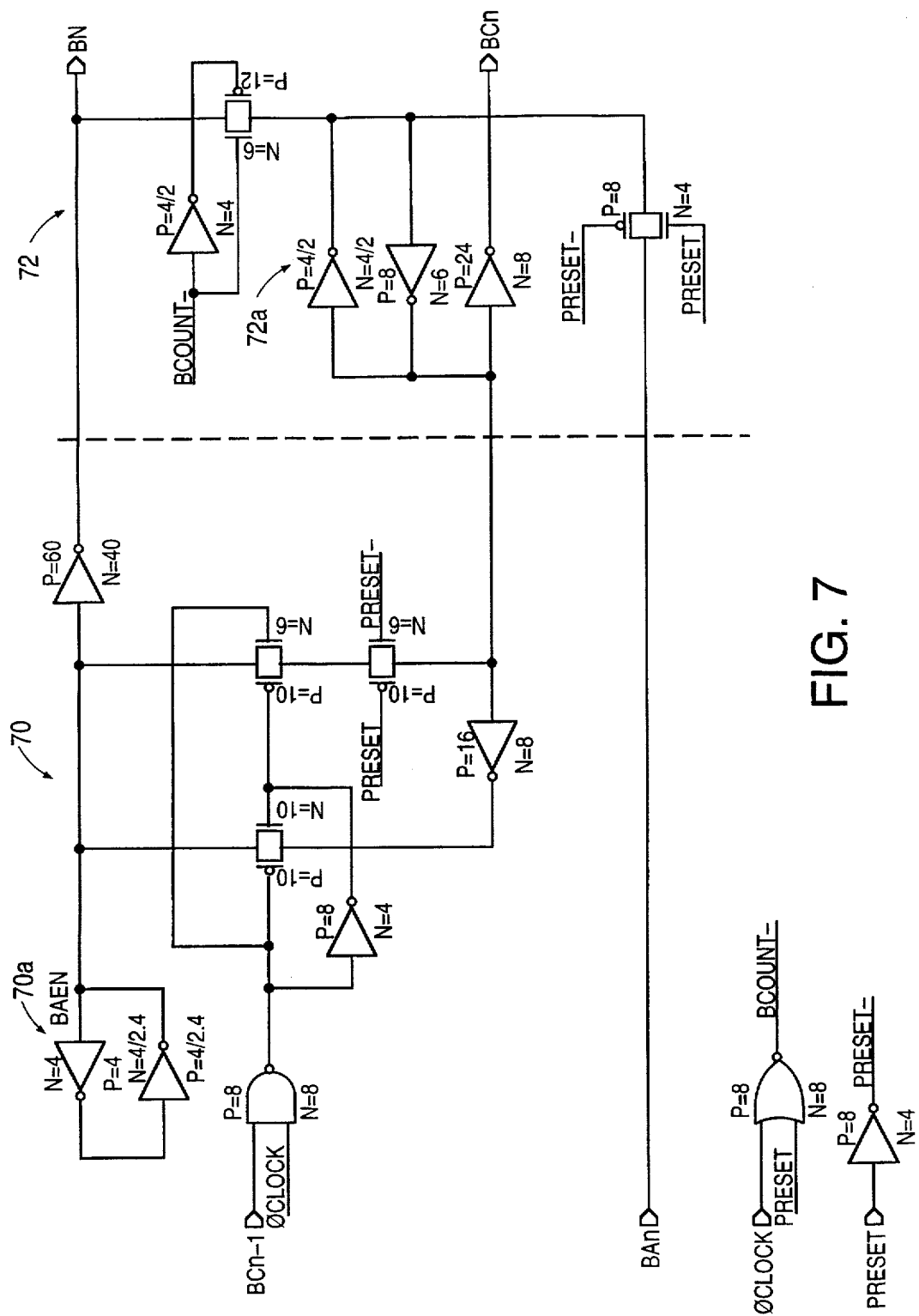

Table 1 shows the signal designations in the block diagram FIG. 3 and the corresponding signal designations in schematic FIGS. 5 to 10, and in the corresponding timing diagram of FIGS. 11(a), 11(b). In Table 1 there is no schematic equivalent to the sequence control signal in FIG. 3, since as explained above the circuit shown in the schematic of FIGS. 5 to 10 uses "up counting" only and does not have a down counting mode option.

TABLE 1

| CHIEF SIGNALS - EQUIVALENCES | | |
|---|---|---|
| BLOCK DIAGRAM - FIG. 3 | SCEMATIC - FIGS. 5-10 | TIMING CHART - FIG. 11 |
| Start address (An) | Same | Yn |
| PRESET | Same | Same |
| External Address | $A_n$ | Address |
| Internal Address | BN, (Burst Address N) | Address Sequencer |
| $\phi_{clock}$ | $\phi_{clock}$ signal generation sequence: CAS-PAD → CAS1$_b$ → BAEN- → $\phi_{clock}$ | $\phi_{clock}$ |
| Sequence | (up counting is inherent | |

TABLE 1-continued
CHIEF SIGNALS - EQUIVALENCES

| BLOCK DIAGRAM - FIG. 3 | SCHEMATIC - FIGS. 5-10 | TIMING CHART - FIG. 11 |
|---|---|---|
| Control | so this control is not required) | |
| External Address Enable | AH (address HOLD) [functions as external address latching and disable at same time] | AH |
| Internal Address Enable | BAEN- (Burst Address Enable- ) | BAEN - |
| Address Out | $Y_{m\text{-}L}$, $Y_{mL}$, $Y_{m\text{-}R}$, $Y_{mR}$ (two pairs per single address), | Address Out |
| (Not Shown) | $BC_n$ (Burst Counter Carry - Output) BCN-1 (Burst Counter Carry - Input) | |

Table 2 shows the externally provided input signals/-lines for the circuit of FIGS. 5 to 10.

TABLE 2
EXTERNALLY PROVIDED INPUTS

| NAME | DESCRIPTION |
|---|---|
| $A_n$ | External address |
| $V_{cc}$ | power |
| L | left decoder address enable |
| R | right decoder address enable |
| YS | column address power up |
| AS | Address Sense |
| CAS-PAD | Column Address Strobe input |
| MUX- | Row - column address multiplex |
| BE/OE | Burst enable/output enable input |
| AH | External address enable |
| ATDOE | Output enable control |
| WE- | Write Enable- |
| WE1 | Write Enable |

Table 3 shows the output signals for the circuit of FIGS. 5 to 10.

TABLE 3
EXTERNAL OUTPUT SIGNALS

| NAME | DESCRIPTION |
|---|---|
| $Y_{m\text{-}L}$ | left address bit inverted |
| $Y_{mL}$ | left address bit |
| $Y_{m\text{-}R}$ | right address bit inverted |
| $y_{mR}$ | right address bit |

Table 4 shows the internal signals for the circuit of FIGS. 5 to 10.

TABLE 4

| NAME | DESCRIPTION |
|---|---|
| BAEN- | Internal address enable |
| BN | Internal address |
| $BA_n$ | Internal Start Address |
| BM | Burst mode |
| $BC_n$ | Counter carry output |
| $BC_{n\text{-}1}$ | Counter carry input |
| PRESET | Preset Timing |
| $CAS1_b$ | Timing |
| $\phi_{clock}$ | $\phi$ Clock Timing |

Figure 5A:
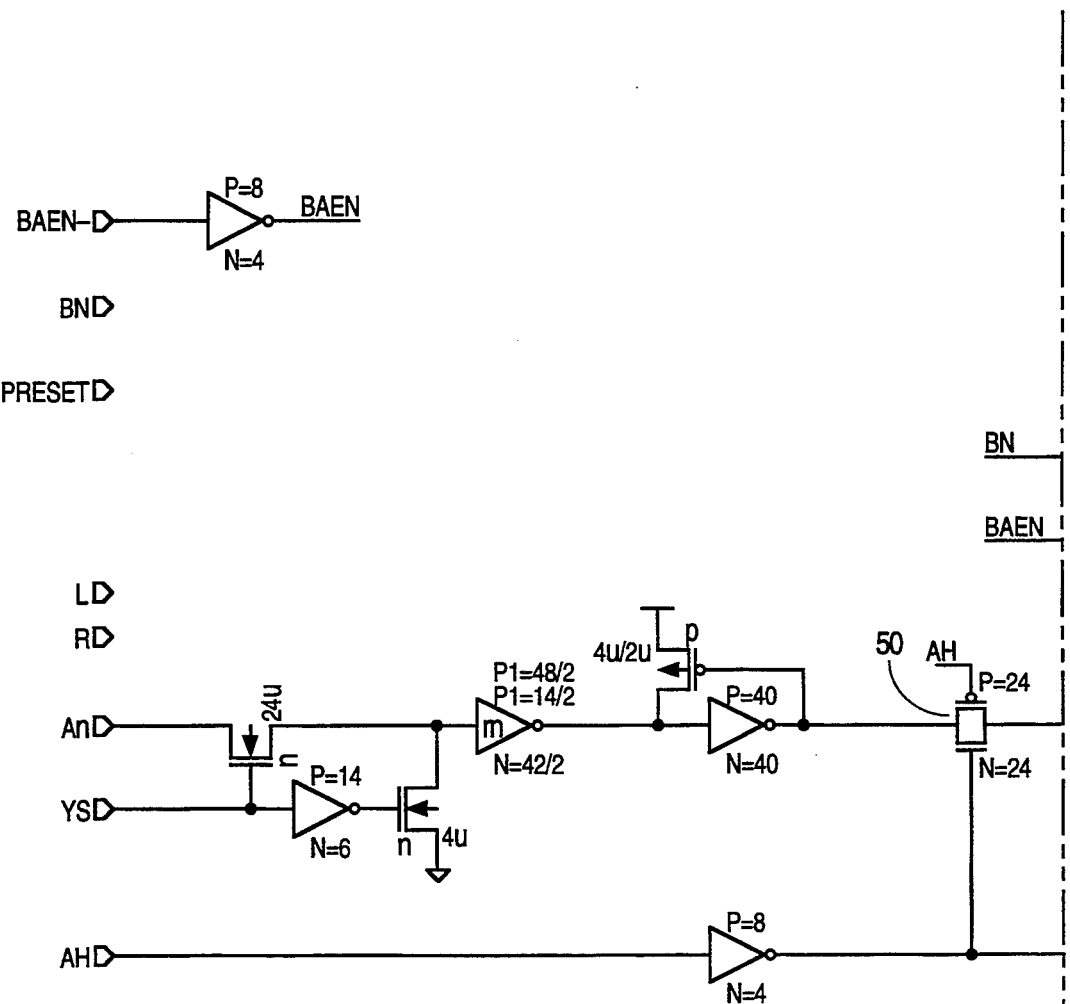
FIG. 5 shows a schematic of the internal address enable switch, external address enable switch, and output buffer in accordance with the present invention.
Figures 5, 5B:
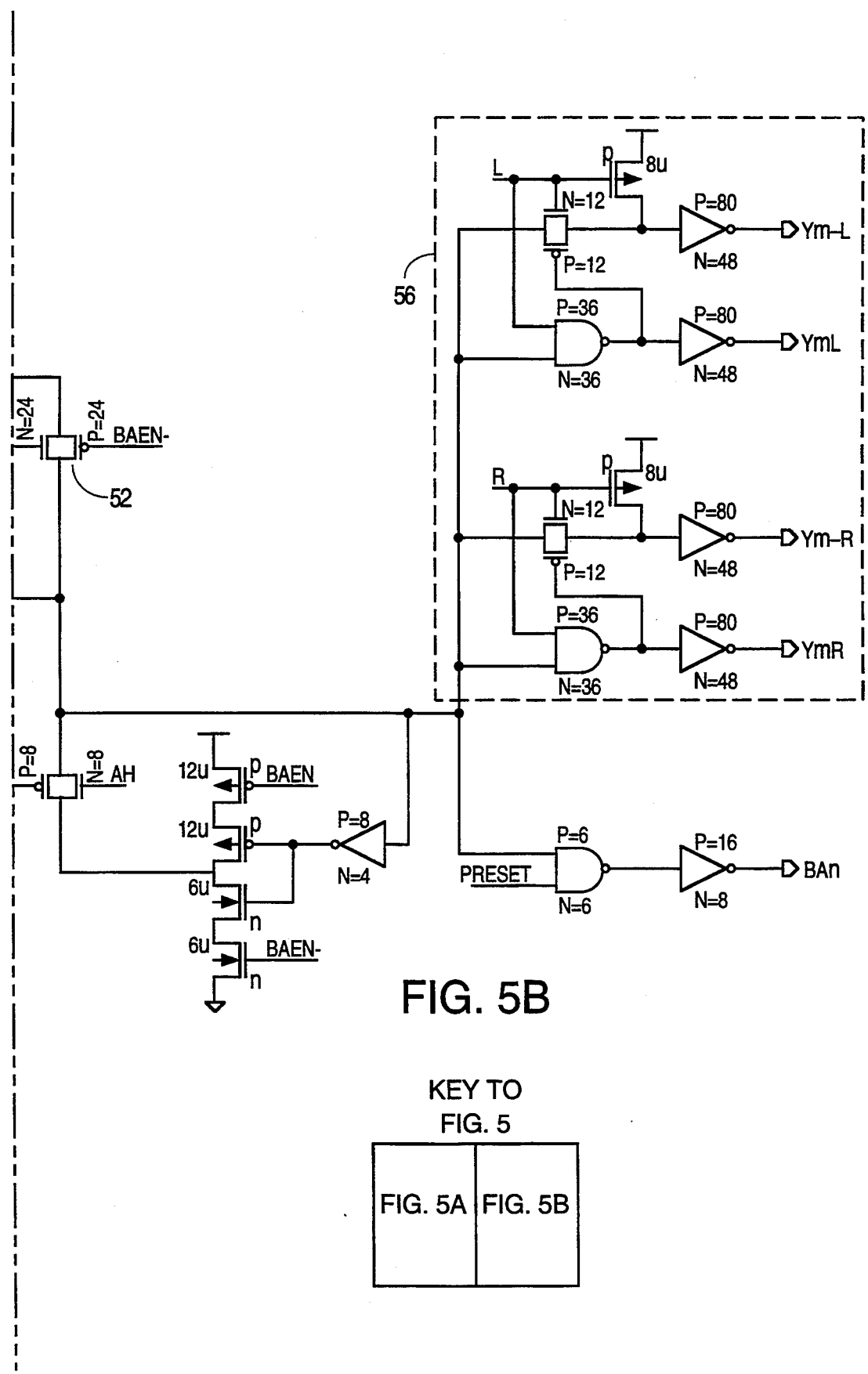
Figure 6A:
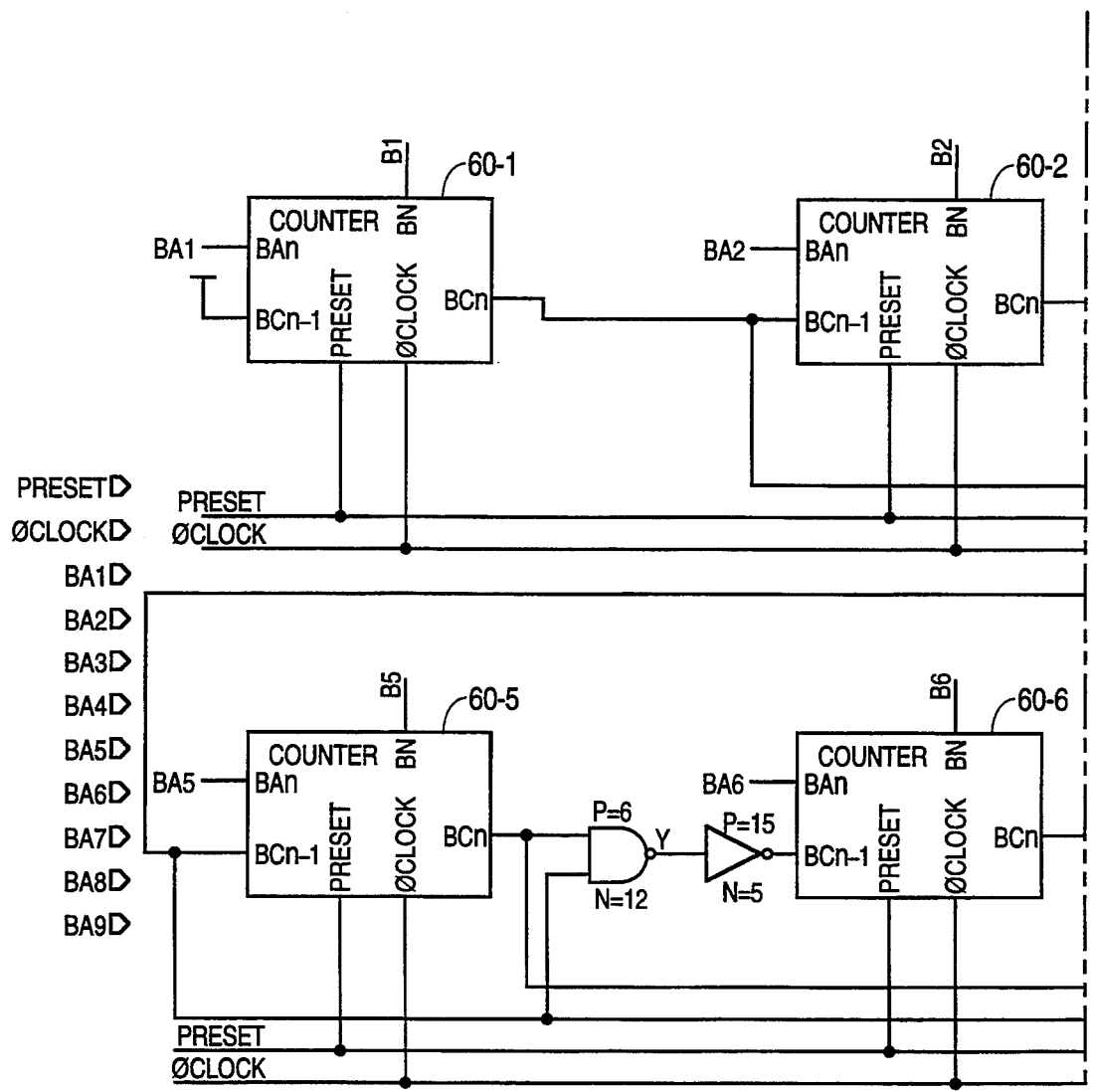
FIG. 6 shows a counter in accordance with the present invention.
Figure 6B:
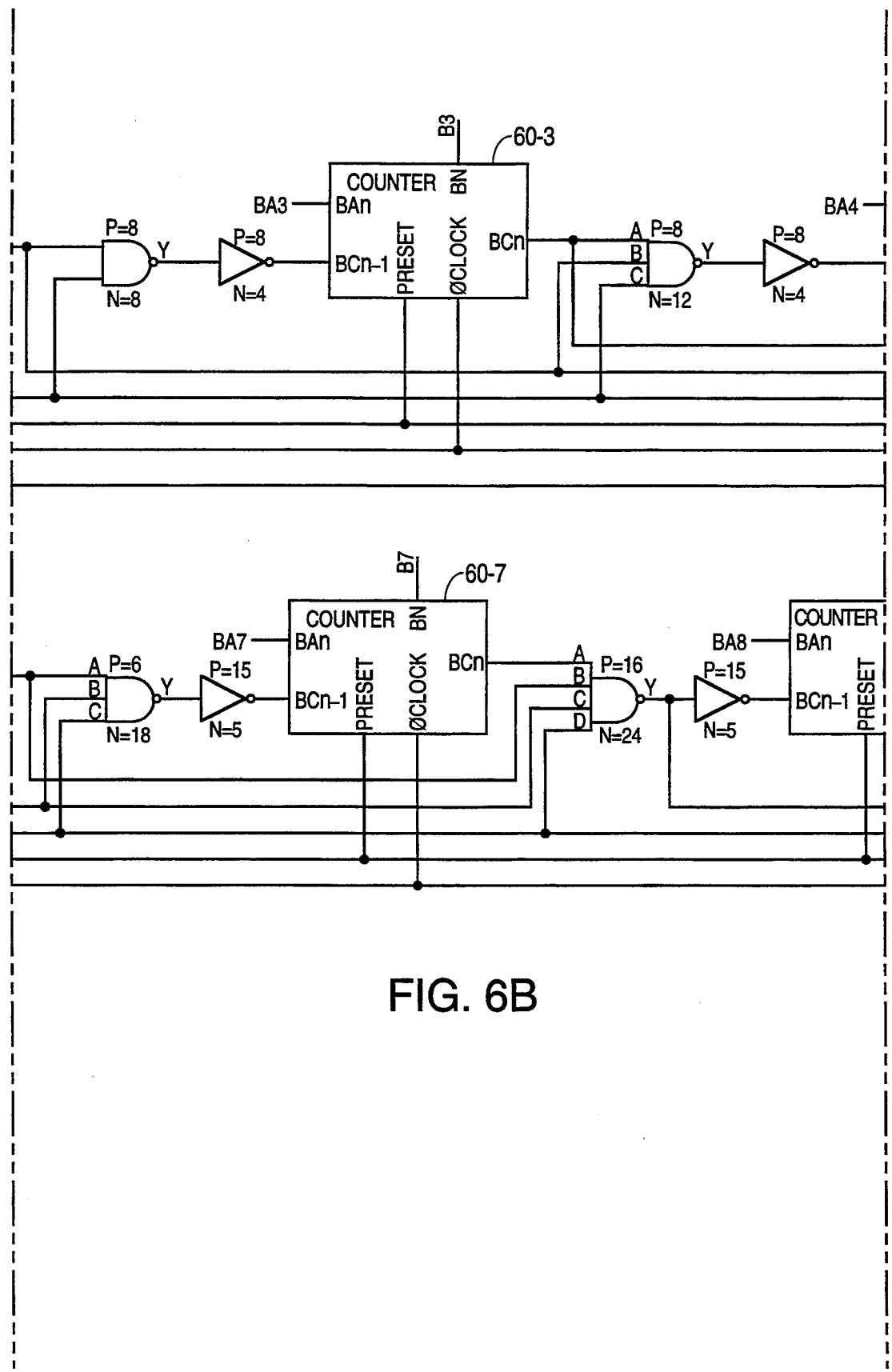
Figure 6C:
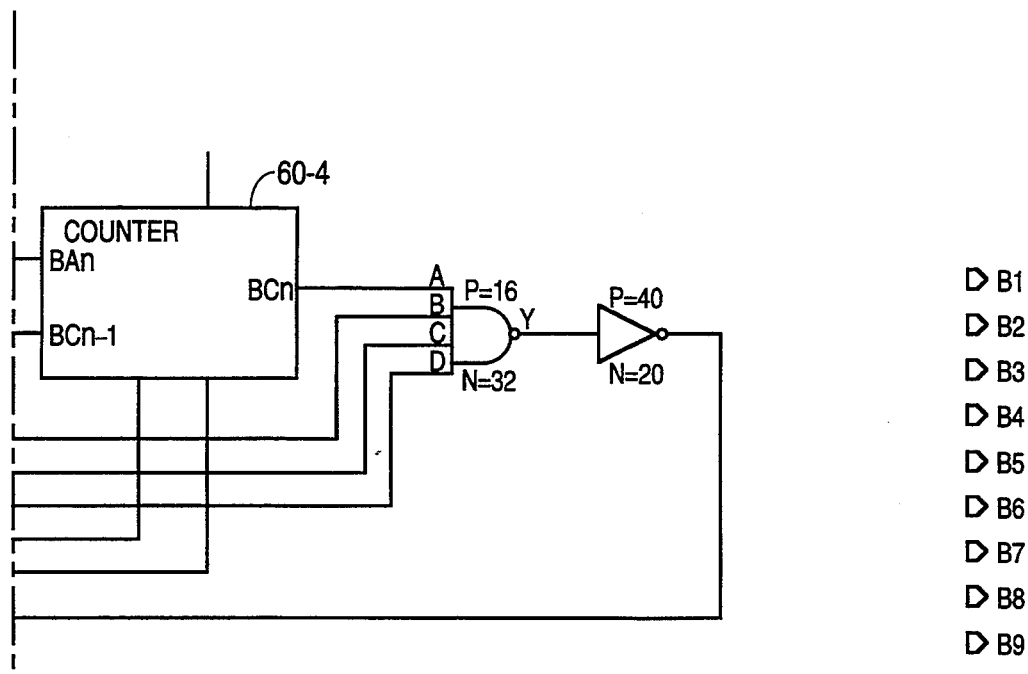
Figure 6C:
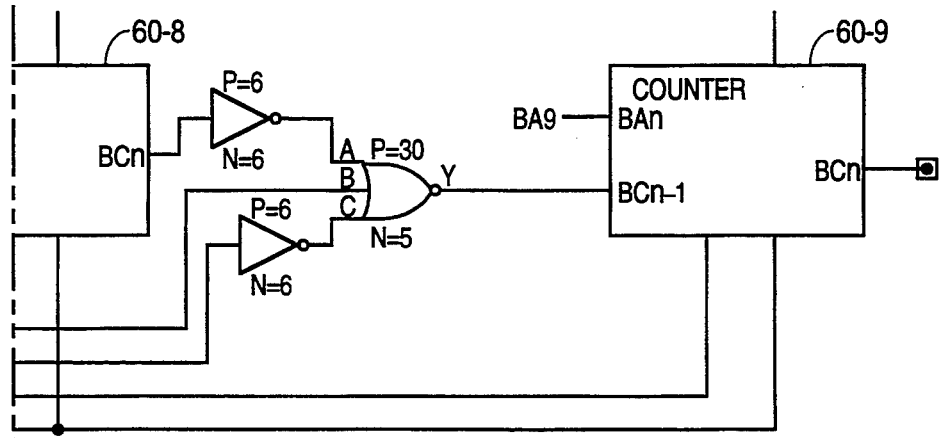

FIG. 5 corresponds most closely to the block diagram of FIG. 3; however FIG. 5 is for a single address bit and hence shows only one of nine such identical circuits as would be used in FIG. 3. These nine circuits are connected in parallel to provide a nine bit address output signal in this particular exemplary embodiment of the invention.

With reference to FIG. 5, input signal An corresponds to the external Address $A_n$ on line 34 in FIG. 3. Signal AH (address hold) functions as the external address latching and disable. This is the external address enable signal, controlling switch 50 in FIG. 5 which corresponds to switch 24 in FIG. 3.

Similarly, the internal address supplied on line 42 of FIG. 3 is designated signal BN in FIG. 5, and is provided as an input to switch 52 corresponding to switch 26 in FIG. 3. Switch 52 is controlled by the internal address enable signal which in FIG. 5 is designated BAEN-. (The inverse of signal BAEN.) It is to be understood that the signal BN is provided from the counter portion of the address generator, described below.

Buffer 22 of FIG. 3 corresponds to the buffer circuitry 56 of FIG. 5. The outputs of the buffer circuitry of FIG. 5 are designated as a "left" and "right" Y (column address) and the inverses thereof ($Y_{m\text{-}L}$, $Y_{mL}$, $Y_{m\text{-}R}$ and $Y_{mR}$). (Note there are two decoders, one for the left memory block and the other for the right memory block.) The output of buffer 56 corresponds to one bit of the address out signal of FIG. 3.

The left and right (L, R) signals of FIG. 5 control the buffer 56 outputs, to provide address signals to left or right decoders respectively. Also provided is column address power up signal YS, which disables the input address pass when the chip is in the precharge state. The internal start address output by the circuit of FIG. 5 (designated $BA_n$) is an input to the associated counter cell, as described below.

FIG. 6 shows the counter (corresponding to the address sequencer 20 of FIG. 3) providing a nine-bit count. The counter has nine identical cells 60-1, 60-2, . . . , 60-9 connected as shown. Each cell has as a first input the internal start address $BA_n$. The second cell input is the carry signal designated $BC_{n\text{-}1}$ from the prior cell. Each cell also receives a first timing signal PRESET, and a second timing signal $\phi_{clock}$. The output of each counter cell is an output address bit BN (which is the address out) which then goes to buffer 56 of FIG. 5, and a second output $BC_n$ which is the carry value to the subsequent cell.

It is to be understood that the counter of FIG. 6 occurs only once in the address sequencer 20 and services all nine address buffer circuits, of which only one is shown in FIG. 5.

Figure 7:
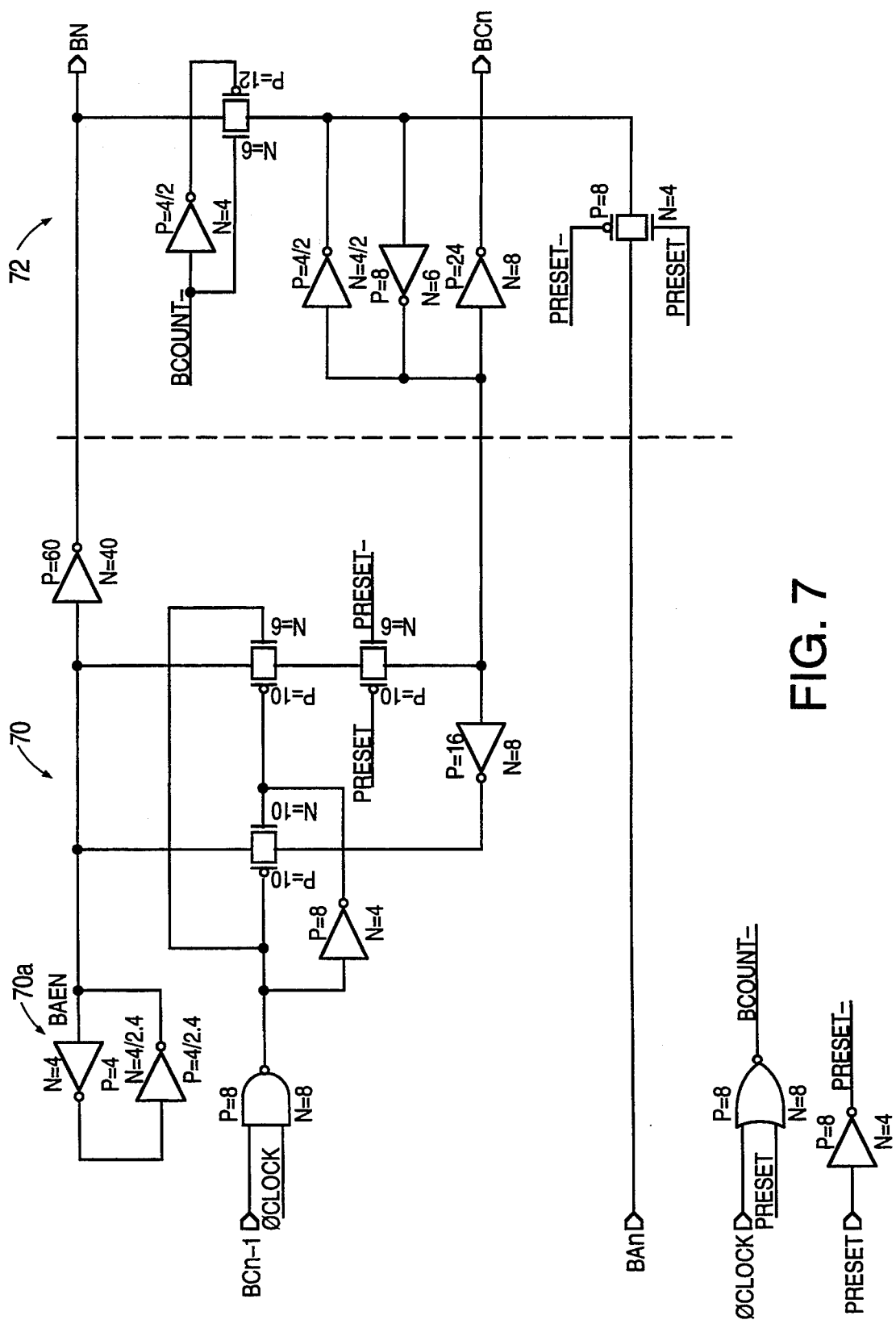
FIG. 7 shows detail of one cell of the counter of FIG. 6.

FIG. 7 shows details of one of the cells of FIG. 6. Signal $BC_{n\text{-}1}$ is the carry input signal, while signal $BA_n$ is the external address signal. The timing signals are $\phi_{clock}$ and PRESET (and their inverses). The cell output is the "real" address BN and a carry value $BC_n$ to the next cell. The cell of FIG. 7 includes conventionally a left-hand side which is the "slave" side 70 and a right hand side which is the "master" side 72 (indicated by the broken line). Thus, there are two latches 70a, 72a one for each side of the counter cell, with one latch at any one time updating its value while the second latch is holding the previously calculated data and transmitting it as output.

Figure 8A:
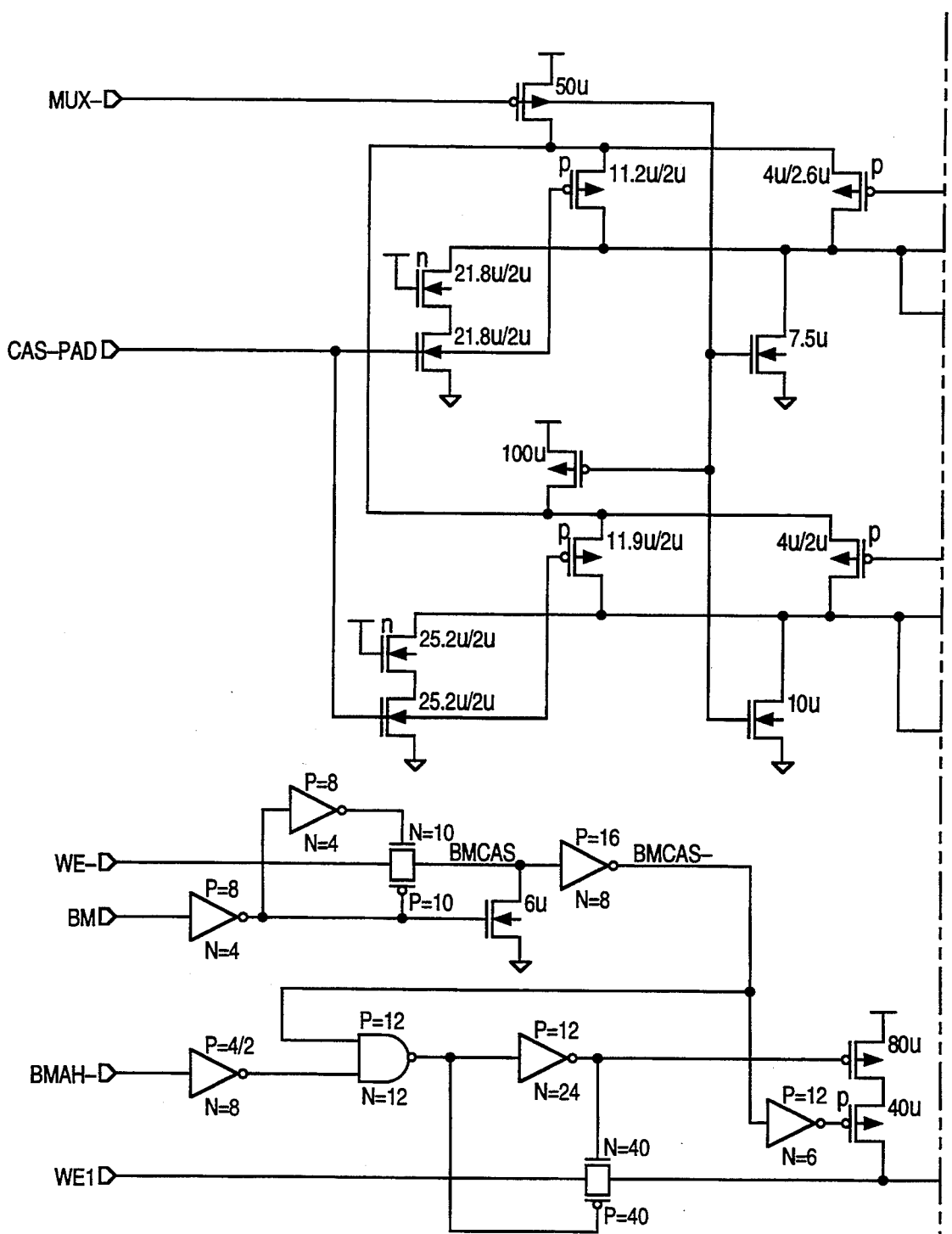
FIGS. 8, 9, and 10 show circuitry for generation of the timing signals for the address generator in accordance with the present invention.
Figure 8B:
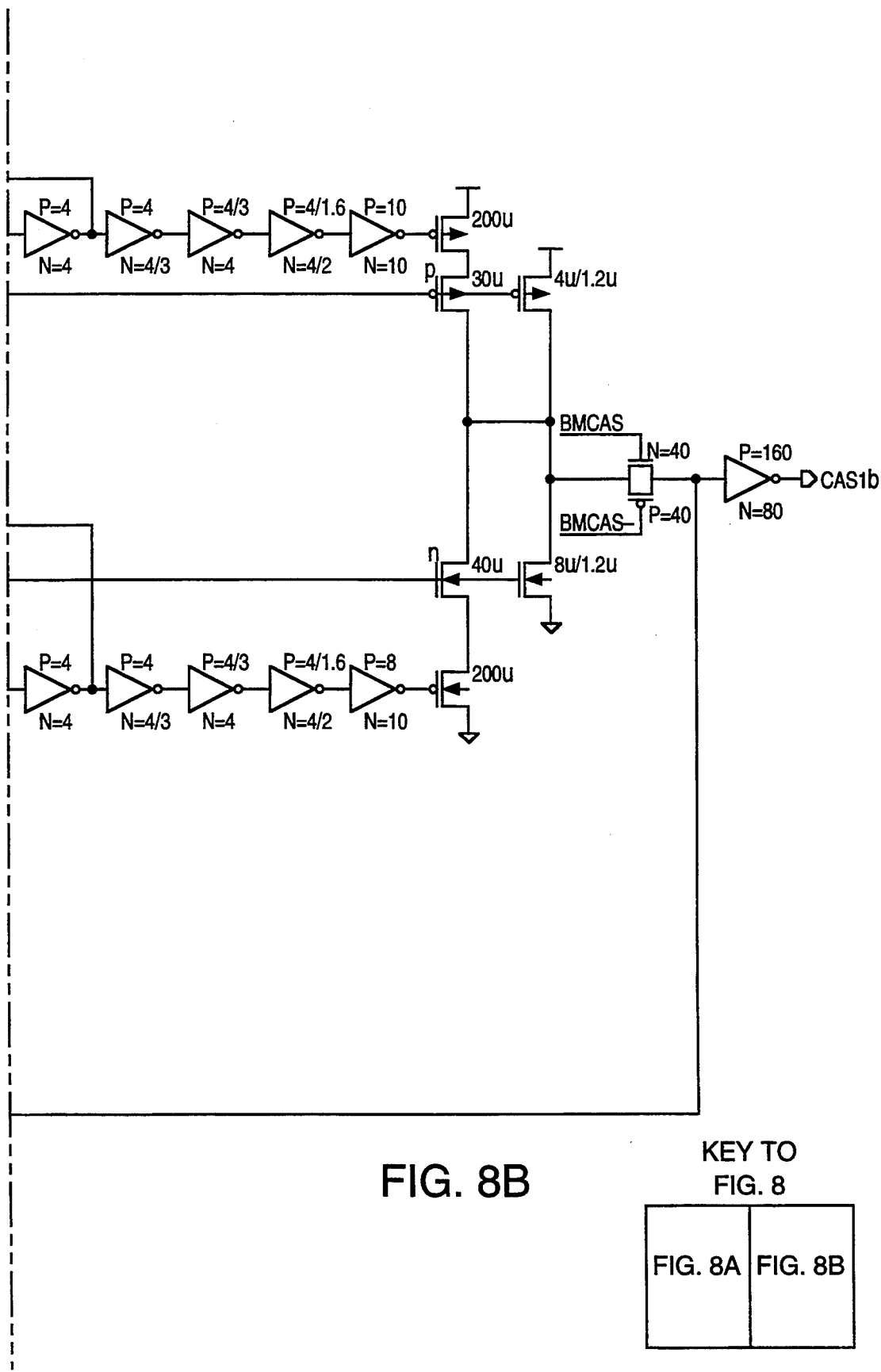

FIGS. 8, 9 and 10 show circuitry for generating the timing signals for the serial address generator. The two externally provided timing signals are RAS and CAS-PAD. These in turn generate as shown the internal timing signals. The sequence is that the input clock signal CAS-PAD generates timing signal $CAS1_b$ which in turn generates signal BAEN- which in turn generates signal $\phi_{clock}$. The $\phi_{clock}$ signal of FIG. 3 is shown in the timing diagram of FIGS. 11(a), 11(b).

FIG. 8 shows the circuitry which provides the timing signal CAS1$_b$ which is a timing signal for the above-described counter circuitry. Note that signal CAS1$_b$ is in part determined by the signal BM (burst mode) and by the signal WE1 which in this case is the burst write input signal.

FIGS. 11a and 11b show the timing for the signals of FIGS. 5 to 10. The start address (designated A$_n$ in FIG. 3) is designated Y$_N$ in the timing diagram of FIGS. 11a and 11b. The output signal of the counter is designated Y$_{N+1}$, Y$_{N+2}$, ... in the timing diagram. It can be seen that when the clock signal AS goes high, and after a particular period, the PRESET signal goes high. In turn, the PRESET signal going low is determined by the signal CAS-PAD going low.

The overall clock speed of the chip in terms of address generation is determined by the signal CAS-PAD; in one embodiment this signal has a 15 nanosecond period, providing a 66 MHz operating speed.

It is to be understood that in a typical operation of the serial address generator, the associated memory array is considered to be an array of memory cells arranged in rows and columns. Each "page" is one row, with the first address on the page being that of the first memory cell in the column. Signal BE/$\overline{OE}$, (burst enable output enable) at the rising edge of AS determines whether one is to be in burst mode or in normal page mode. Signal BE/$\overline{OE}$ is determined by the host computer. The output of buffer 56 of the circuit of FIG. 5 is connected typically to a column predecoder for determining the particular column of a memory array to be addressed. A predecoder buffers the address signals prior to provision thereof to the decoder itself. The predecoder in this case saves power and increases operating speed, by serving as a buffer for the decoder proper.

The above description is illustrative and not limiting; further modifications will be apparent to one skilled in the art and are intended to be covered by the appended claims.

We claim:

1. An address generator for a random access memory, comprising:
   an address sequencer having a clock input terminal, a preset terminal, and an output terminal;
   an internal address enable switch connected between the output terminal of the address sequencer and an output terminal of the address generator; and
   an external address enable switch connected between an address input terminal of the address generator and the output terminal of the address generator;
   wherein the address sequencer includes means for incrementally timing the address sequencer to generate a second address in a sequence of addresses while a first address is being supplied to the output terminal of the address generator by the external address enable switch.

2. The address generator of claim 1, further comprising:
   means for controlling the internal address enable switch; and
   means for controlling the external address enable switch, wherein the means for controlling the external address enable switch closes the external address enable switch for a duration of the first address of the sequence of addresses, and wherein during the duration the external address enable switch is closed, the address sequencer generates the second address in the sequence of addresses.

3. The address generator of claim 1, wherein the second address is output to the output terminal of the address sequencer only when the internal address enable switch is closed.

4. The address generator of claim 1, further comprising a buffer serially connected between the output terminal of the address sequencer and the output terminal of the address generator.

5. The address generator of claim 2, further comprising means for providing a preset signal of a predetermined duration and level to the preset terminal during at least a portion of the duration of the first address, the preset signal setting the address sequencer to the second address in the sequence of addresses.

6. The address generator of claim 2, further comprising means for providing clock signals of predetermined level to the clock input terminal, a first of the clock signals occurring only after the duration of the first address.

7. The address generator of claim 2, wherein the address sequencer includes a counter having a master portion and a slave portion.

8. The address generator of claim 1, further comprising means for providing an externally generated address to the address input terminal, wherein the externally generated address is a first address of a page of the random access memory.

9. An address generator for a random access memory, comprising:
   means for providing a first address in a sequence of addresses, the first address being provided from an external source as an output address;
   an address sequencer for generating the subsequent addresses in the sequence of addresses, a second address in the sequence being provided as an output address immediately following the generation of the first address;
   an internal address enable switch connected between an output terminal of the address sequencer and an output terminal of the address generator;
   an external address enable switch connected between an address input terminal of the address generator and the output terminal of the address generator; and
   means for incrementally timing the address sequencer during a preset period to generate the second address at a same time that the first address is being provided from the external source.

10. A method of generating a sequence of addresses for addressing a random access memory, comprising the steps of:
    providing from an external source a first address in the sequence as an output address;
    switching in the first address as an output address during a preset period;
    then, providing from an address sequencer a second address in the sequence as an output address, the second address being generated by incremental timing during at least a part of a duration of the step of providing the first address; and
    switching in the second address as an output address after the preset period.

11. The address generator of claim 2, wherein the means for controlling the internal address enable switch is a logical inversion of the signals provided to the clock input terminal.

12. An address generator for a random access memory, comprising:

an address sequencer having a clock input terminal, a preset terminal, and an output terminal;

an internal address enable switch connected between the output terminal of the address sequencer and an output terminal of the address generator;

an external address enable switch connected between an address input terminal of the address generator and the output terminal of the address generator; and means for providing a preset signal of a predetermined duration and level to the preset terminal during at least a portion of the duration of the first address, the preset signal setting the address sequencer to the second address in the series;

wherein the address sequencer generates a second address in a sequence of addresses while a first address is being supplied to the output terminal of the address generator by the external address enable switch.

13. An address generator for a random access memory, comprising:

an address sequencer having a clock input terminal, a preset terminal, and an output terminal;

an internal address enable switch connected between the output terminal of the address sequencer and an output terminal of the address generator;

an external address enable switch connected between an address input terminal of the address generator and the output terminal of the address generator; and means for providing clock signals of predetermined level to the clock input terminal, a first of the clock signals occurring only after the duration of the first address;

wherein the address sequencer generates a second address in a sequence of addresses while a first address is being supplied to the output terminal of the address generator by the external address enable switch.

14. An address generator for a random access memory, comprising:

an address sequencer having a clock input terminal, a preset terminal, and an output terminal;

an internal address enable switch connected between the output terminal of the address sequencer and an output terminal of the address generator; and an external address enable switch connected between an address input terminal of the address generator and the output terminal of the address generator;

wherein the address sequencer generates a second address in a sequence of addresses while a first address is being supplied to the output terminal of the address generator by the external address enable switch, and wherein the address sequencer includes a counter having a master portion and a slave portion.

* * * * *

UNITED STATES PATENT AND TRADEMARK OFFICE
CERTIFICATE OF CORRECTION

PATENT NO. : 5,452,261
DATED : 09/19/95
INVENTOR(S) : Chung, Jinyong; Murray, Michael A.

It is certified that error appears in the above-identified patent and that said Letters Patent is hereby corrected as shown below:

Replace FIG. 7 with attached FIG. 7.

Signed and Sealed this

Sixteenth Day of March, 1999

*Attest:*

Q. TODD DICKINSON

*Attesting Officer*      *Acting Commissioner of Patents and Trademarks*